US010153665B2

(12) United States Patent
Tsai et al.

(10) Patent No.: US 10,153,665 B2
(45) Date of Patent: Dec. 11, 2018

(54) METHOD FOR ADJUSTING OUTPUT POWER FOR INDUCTION TYPE POWER SUPPLY SYSTEM AND RELATED SUPPLYING-END MODULE

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 214 days.

(21) Appl. No.: 15/407,262

(22) Filed: Jan. 17, 2017

(65) Prior Publication Data

US 2017/0126072 A1    May 4, 2017

Related U.S. Application Data

(63) Continuation-in-part of application No. 14/822,875, filed on Aug. 10, 2015, now Pat. No. 9,960,639.

(30) Foreign Application Priority Data

Jan. 14, 2015  (TW) .............................. 104101227 A
Aug. 31, 2016  (TW) .............................. 105127999 A

(51) Int. Cl.
*H02J 7/02*  (2016.01)
*G01R 19/04*  (2006.01)
(Continued)

(52) U.S. Cl.
CPC .............. *H02J 50/12* (2016.02); *G01R 19/04* (2013.01); *G01R 19/252* (2013.01); *H02J 7/025* (2013.01);
(Continued)

(58) Field of Classification Search
CPC ........ H02J 50/12; H02J 50/10; H04B 5/0037; G01R 19/04
See application file for complete search history.

(56) References Cited

U.S. PATENT DOCUMENTS 4,393,516 A    7/1983  Itani
5,270,998 A   12/1993  Uchiumi
(Continued)

FOREIGN PATENT DOCUMENTS

CN    1142649 A    2/1997
CN    1476535 A    2/2004
(Continued)

OTHER PUBLICATIONS

Yang, "A Multi-Coil Wireless Charging System with Parasitic Mental Detection", Donghua University Master Dissertation, China Master's Theses Full-text Database, Engineering Technology II, vol. 09, May 2014.

*Primary Examiner* — Ryan Johnson
(74) *Attorney, Agent, or Firm* — Winston Hsu

(57) ABSTRACT

A method is used for a supplying-end module of an induction type power supply system, for adjusting output power of the induction type power supply system. The method includes driving a supplying-end coil of the supplying-end module by using a first driving signal and a second driving signal, and setting a phase shift quantity between the first driving signal and the second driving signal; detecting a coil signal of the supplying-end coil to determine a peak location of the coil signal; determining a peak deviation rate of the peak location according to a starting point of a period of the second driving signal and a zero load point; and adjusting the phase shift quantity according to the peak deviation rate, in order to adjust the output power.

15 Claims, 12 Drawing Sheets

(51) Int. Cl.
*H02J 50/10* (2016.01)
*H02J 50/12* (2016.01)
*H02J 50/60* (2016.01)
*H02J 50/80* (2016.01)
*G01R 19/252* (2006.01)
*H02M 3/337* (2006.01)

(52) U.S. Cl.
CPC .............. *H02J 50/10* (2016.02); *H02J 50/60* (2016.02); *H02J 50/80* (2016.02); *H02M 3/337* (2013.01)

(56) References Cited

U.S. PATENT DOCUMENTS

| | | | |
|---|---|---|---|
| 7,720,452 | B2 | 5/2010 | Miyahara |
| 7,939,963 | B2 | 5/2011 | Chang |
| 8,072,310 | B1 | 12/2011 | Everhart |
| 8,217,621 | B2 | 7/2012 | Tsai |
| 8,412,963 | B2 | 4/2013 | Tsai |
| 8,417,359 | B2 | 4/2013 | Tsai |
| 8,422,420 | B1 | 4/2013 | Gulasekaran |
| 8,731,116 | B2 | 5/2014 | Norconk |
| 8,772,979 | B2 | 7/2014 | Tsai |
| 8,810,072 | B2 | 8/2014 | Tsai |
| 9,048,881 | B2 | 6/2015 | Tsai |
| 9,075,587 | B2 | 7/2015 | Tsai |
| 2003/0123168 | A1 | 7/2003 | Yokomizo |
| 2005/0076102 | A1 | 4/2005 | Chen |
| 2006/0199146 | A1 | 9/2006 | Mandelkern |
| 2008/0030398 | A1 | 2/2008 | Nakamura |
| 2009/0026844 | A1 | 1/2009 | Iisaka |
| 2009/0174263 | A1 | 7/2009 | Baarman |
| 2009/0271048 | A1 | 10/2009 | Wakamatsu |
| 2009/0284082 | A1 | 11/2009 | Mohammadian |
| 2009/0302800 | A1 | 12/2009 | Shiozaki |
| 2010/0098177 | A1 | 4/2010 | Hamaguchi |
| 2010/0225173 | A1* | 9/2010 | Aoyama ................ H02J 5/005 307/104 |
| 2010/0237943 | A1 | 9/2010 | Kim |
| 2010/0270867 | A1 | 10/2010 | Abe |
| 2010/0277003 | A1 | 11/2010 | Von Novak |
| 2011/0196544 | A1 | 8/2011 | Baarman |
| 2011/0204711 | A1 | 8/2011 | Norconk |
| 2012/0153739 | A1 | 6/2012 | Cooper |
| 2012/0200278 | A1 | 8/2012 | Yost |
| 2012/0242159 | A1 | 9/2012 | Lou |
| 2012/0272076 | A1 | 10/2012 | Tsai |
| 2012/0293009 | A1 | 11/2012 | Kim |
| 2013/0015705 | A1 | 1/2013 | Abe |
| 2013/0049484 | A1 | 2/2013 | Weissentern |
| 2013/0094598 | A1 | 4/2013 | Bastami |
| 2013/0127407 | A1 | 5/2013 | Kao |
| 2013/0162054 | A1 | 6/2013 | Komiyama |
| 2013/0162204 | A1 | 6/2013 | Jung |
| 2013/0175873 | A1 | 7/2013 | Kwon |
| 2013/0175937 | A1 | 7/2013 | Nakajo |
| 2013/0176023 | A1 | 7/2013 | Komiyama |
| 2013/0187476 | A1 | 7/2013 | Tsai |
| 2013/0253898 | A1 | 9/2013 | Meagher |
| 2013/0267213 | A1 | 10/2013 | Hsu |
| 2013/0342027 | A1 | 12/2013 | Tsai |
| 2014/0024919 | A1 | 1/2014 | Metzenthen |
| 2014/0077616 | A1 | 3/2014 | Baarman |
| 2014/0084857 | A1 | 3/2014 | Liu |
| 2014/0184152 | A1 | 7/2014 | Van Der Lee |
| 2014/0355314 | A1 | 12/2014 | Ryan |
| 2015/0028875 | A1 | 1/2015 | Irie |
| 2015/0044966 | A1 | 2/2015 | Shultz |
| 2015/0054355 | A1 | 2/2015 | Ben-Shalom |
| 2015/0123602 | A1 | 5/2015 | Patino |
| 2015/0162054 | A1 | 6/2015 | Ishizu |
| 2015/0162785 | A1 | 6/2015 | Lee |
| 2015/0207333 | A1 | 7/2015 | Baarman |
| 2015/0285926 | A1 | 10/2015 | Oettinger |
| 2016/0064951 | A1* | 3/2016 | Yamamoto ............. H02J 17/00 307/104 |
| 2016/0241086 | A1 | 8/2016 | Jung |
| 2016/0349782 | A1 | 12/2016 | Tsai |

FOREIGN PATENT DOCUMENTS

| | | |
|---|---|---|
| CN | 1930790 A | 3/2007 |
| CN | 101106388 A | 1/2008 |
| CN | 101834473 A | 9/2010 |
| CN | 101907730 A | 12/2010 |
| CN | 101924399 A | 12/2010 |
| CN | 101978571 A | 2/2011 |
| CN | 102055250 A | 5/2011 |
| CN | 102157991 A | 8/2011 |
| CN | 102474133 A | 5/2012 |
| CN | 102804619 A | 11/2012 |
| CN | 102904475 A | 1/2013 |
| CN | 102983638 A | 3/2013 |
| CN | 103069689 A | 4/2013 |
| CN | 103248130 A | 8/2013 |
| CN | 103425169 A | 12/2013 |
| CN | 103852665 A | 6/2014 |
| CN | 103975497 A | 8/2014 |
| CN | 104521151 A | 4/2015 |
| CN | 104685760 A | 6/2015 |
| CN | 104734370 A | 6/2015 |
| CN | 105049008 A | 11/2015 |
| CN | 105449875 A | 3/2016 |
| CN | 205105005 U | 3/2016 |
| EP | 2 793 355 A1 | 10/2014 |
| JP | 2008206305 A | 9/2008 |
| JP | 2010213414 A | 9/2010 |
| JP | 2013135518 A | 7/2013 |
| JP | 2014171371 A | 9/2014 |
| JP | 2017511117 A | 4/2017 |
| KR | 100650628 B1 | 11/2006 |
| TW | 201034334 A1 | 9/2010 |
| TW | I389416 B1 | 3/2013 |
| TW | I408861 B1 | 9/2013 |
| TW | 201415752 A | 4/2014 |
| TW | 201440368 A | 10/2014 |
| TW | I459676 B | 11/2014 |
| TW | I472897 B | 2/2015 |
| TW | I483509 B | 5/2015 |
| WO | 2013043974 A2 | 3/2013 |
| WO | 2015154086 A1 | 10/2015 |

\* cited by examiner

METHOD FOR ADJUSTING OUTPUT POWER FOR INDUCTION TYPE POWER SUPPLY SYSTEM AND RELATED SUPPLYING-END MODULE

CROSS REFERENCE TO RELATED APPLICATIONS

This application is a continuation-in-part application of U.S. application Ser. No. 14/822,875, filed on Aug. 10, 2015, the contents of which are incorporated herein by reference.

BACKGROUND OF THE INVENTION

1. Field of the Invention

The present invention relates to a method used for an induction type power supply system, and more particularly, to a method of adjusting output power of an induction type power supply system.

2. Description of the Prior Art

An induction type power supply system includes a power supplying terminal and a power receiving terminal. The power supplying terminal applies a driver circuit to drive a supplying-end coil to generate resonance, in order to send electromagnetic waves. A coil of the power receiving terminal may receive the electromagnetic waves and perform power conversion to generate DC power to be supplied for a device in the power receiving terminal. In general, the power supplying terminal may operate with full-bridge driving or half-bridge driving. The full-bridge driving means the driver unit at the front-end of the coil outputs two driving signals to the two terminals of the coil, respectively. The half-bridge driving means the driver unit only outputs one driving signal to a terminal of the coil, and the other terminal of the coil is connected to ground or receives a constant voltage.

In general, in the full-bridge driving, two driving signals respectively outputted to the two terminals of the supplying-end coil are inverse rectangular waves. In such a condition, in order to perform power control in the power supplying terminal of the induction type power supply system, the operating frequency of the driving signals may be adjusted to vary the operating point. Please refer to FIG. 1, which is a schematic diagram of the resonant curve of the coil of the induction type power supply system. As shown in FIG. 1, the resonant curve illustrates the relations between the sine-wave amplitude and frequency of the coil signal during operations of the coil, wherein the resonant curve includes a maximum amplitude Amax corresponding to an operating frequency F0, which indicates maximum output power of the sine wave. In order to prevent the system from being burnt out due to excessive output power, the operating frequency is usually controlled to be greater than F0, such as F1-F4 shown in FIG. 1. The frequencies F1-F4 correspond to amplitudes A1-A4 of the sine wave on the resonant curve, respectively.

As can be seen from above, the coil may output higher power when operating in a lower operating frequency; and output lower power when operating in a higher operating frequency. Therefore, when the induction type power supply system has no load or a light load, the coil may be controlled to operate at a higher operating frequency (e.g., F4) to drive the load with lower output power (the lower amplitude A4 of the sine wave), in order to prevent redundant power consumption. When the load of the power receiving terminal increases such that the power requirement also increases, the operating frequency may gradually be reduced to F3, F2 or F1, in order to enhance the amplitude of sine wave and the output power to driver the load. The process of adjusting the operating frequency is performed via communications between the power receiving terminal and the power supplying terminal. For example, when the power receiving terminal detects an increase of the load, the power receiving terminal may transmit related information to the power supplying terminal by using signal modulation technology, and the power supplying terminal may increase the output power when receiving the information. After the power adjustment of the power supplying terminal is completed, the power receiving terminal may determine whether the updated power is sufficient to drive the present load. If the power is still insufficient, the power receiving terminal then transmits further information to the power supplying terminal, to notify the power supplying terminal to further increase the output power. In other words, when the load varies, power adjustment may not reach its target at one go; instead, the most appropriate power level may be achieved after several times of information exchange between the power supplying terminal and the power receiving terminal. Therefore, the above method is always time consuming and has a defect of poor stability in the output voltage.

Please refer to FIG. 2, which is a waveform diagram of signals when the load of the power receiving terminal increases. FIG. 2 illustrates waveforms of an output voltage Vout of the power receiving terminal and a coil signal Vc of the supplying-end coil. First of all, the power receiving terminal has a light load or no load, where the output voltage Vout remains at a predetermined voltage and the oscillation amplitude of the coil signal Vc is smaller. At time t0, a sudden load appears and forces the output voltage Vout to fall instantly. Due to the resonant effect of the load, the amplitude of the coil signal Vc may increase instantly. When the power receiving terminal detects the load variation (e.g., by detecting the output voltage Vout), the power supplying terminal does not know this information yet and may not increase the output power immediately. At this moment, the power receiving terminal may modulate and/or encode the data indicating the output voltage Vout and then transmit the data to the power supplying terminal (i.e., time t1). When the power supplying terminal receives the modulation data from the power receiving terminal, the power supplying terminal may adjust operating frequency of the coil to increase the output power, in order to adapt to load variations. However, the increase of the output power still cannot make the output voltage Vout return to the predetermined voltage value; hence, the power receiving terminal transmits another indication to the power supplying terminal, where the indication has data or information indicating a further increase of the output power (i.e., time t2 and t3). The power supplying terminal may gradually increase the output power, until the output voltage Vout reaches the predetermined voltage value. In general, since the modulation data is transmitted periodically, the adjustment of the output power should go through several periods of transmissions of the modulation signal, to allow the output voltage Vout to return to the predetermined voltage value.

If the induction type power supply system has to drive a larger load, a rectangular driving signal having larger amplitude is necessary, to generate larger amplitude on the sine wave signal of the coil. The larger amplitude on the driving signal raises the resonant curve of the coil upwards. Please refer to FIG. 3, which is a schematic diagram of resonant curves of the coil under driving signals having different voltage amplitudes in an induction type power supply system. FIG. 3 illustrates the cases where the driving signals have voltages equal to 5V and 24V. Comparing between these two cases, larger output power is achieved when the driving signal has a voltage equal to 24V. In such a condition, when the induction type power supply system is on standby (i.e., there is no load), larger driving signals may always generate more virtual power, which results in more waste power unless the coil operates in a higher operating frequency. However, due to the operating limitation of the driving elements, the frequency of the driving signals must have an upper limit, and a higher operating frequency is accompanied by more frequent switching of the elements, causing a higher wear and tear on the elements to reduce the life of the elements.

Thus, there is a need to provide another power adjustment method for the induction type power supply system, in order to realize fast power adjustment and also prevent the above drawbacks.

SUMMARY OF THE INVENTION

It is therefore an objective of the present invention to provide a method of adjusting output power for an induction type power supply system and a related supplying-end module in the induction type power supply system, in order to realize fast power adjustment and also reduce power loss of the induction type power supply system on standby.

An embodiment of the present invention discloses a method for a supplying-end module of an induction type power supply system, for adjusting output power of the induction type power supply system. The method comprises driving a supplying-end coil of the supplying-end module by using a first driving signal and a second driving signal, and setting a phase shift quantity between the first driving signal and the second driving signal; detecting a coil signal of the supplying-end coil to determine a peak location of the coil signal; determining a peak deviation rate of the peak location according to a starting point of a period of the second driving signal and a zero load point; and adjusting the phase shift quantity according to the peak deviation rate, in order to adjust the output power.

An embodiment of the present invention further discloses a supplying-end module for an induction type power supply system, for adjusting output power of the induction type power supply system. The supplying-end module comprises a supplying-end coil, at least one power driver unit, a delay generator, a peak detector and a processor. The at least one power driver unit, coupled to the supplying-end coil, is used for sending a first driving signal and a second driving signal to drive the supplying-end coil. The delay generator, coupled to a power driver unit among the at least one power driver unit, is used for generating a delay signal and outputting the delay signal to the power driver unit. The peak detector, coupled to the supplying-end coil, is used for detecting a coil signal of the supplying-end coil to obtain a peak signal in the coil signal. The processor, coupled to the at least one power driver unit, the delay generator and the peak detector, is used for performing the following steps: controlling the delay generator to output the delay signal to set a phase shift quantity between the first driving signal and the second driving signal; obtaining the peak signal from the peak detector and determining a peak location of the coil signal accordingly; determining a peak deviation rate of the peak location according to a starting point of a period of the second driving signal and a zero load point; and adjusting the phase shift quantity according to the peak deviation rate, in order to adjust the output power.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
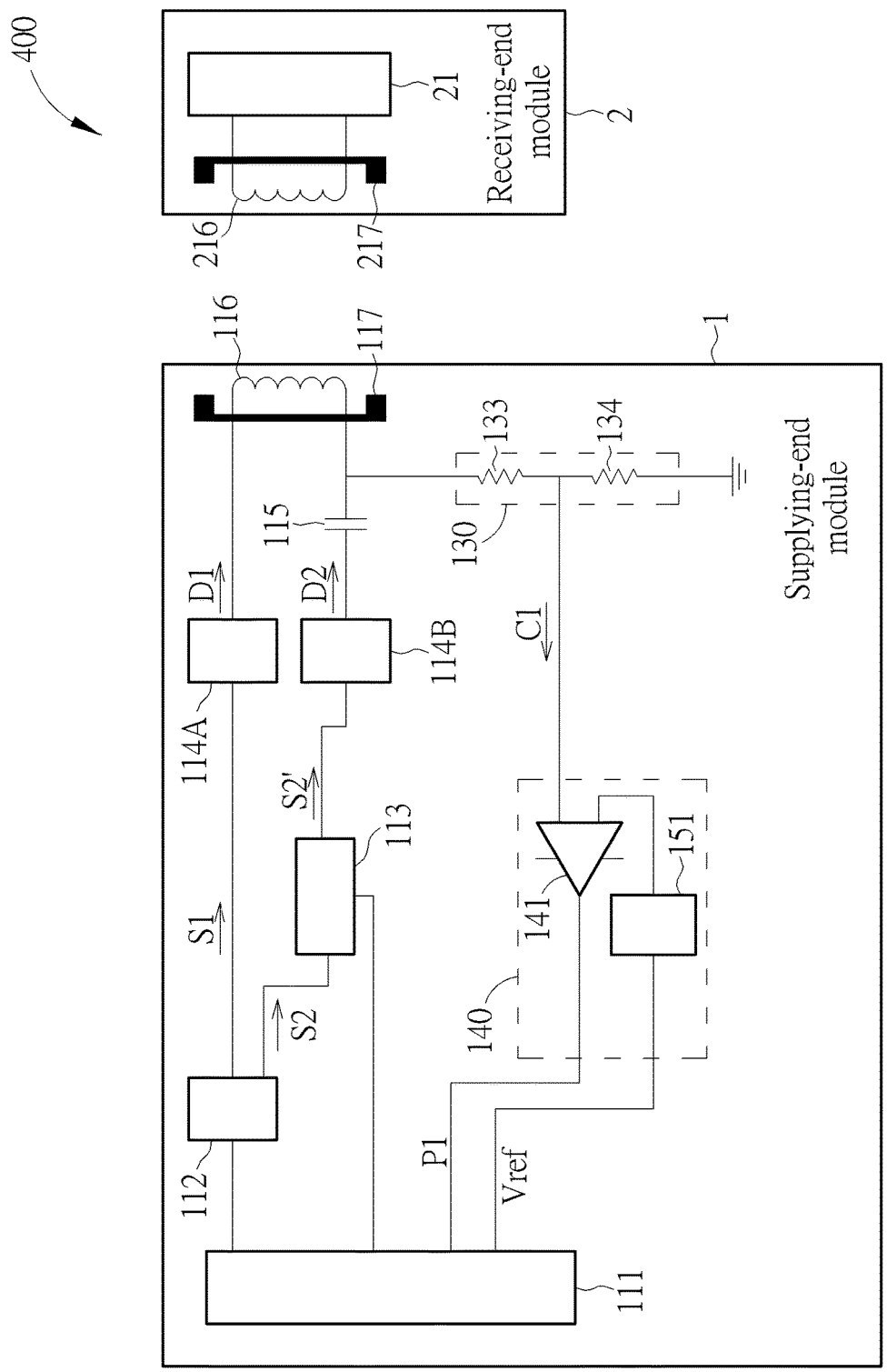
FIG. 4 is a schematic diagram of an induction type power supply system according to an embodiment of the present invention.

Please refer to FIG. 4, which is a schematic diagram of an induction type power supply system 400 according to an embodiment of the present invention. As shown in FIG. 4, the induction type power supply system 400 includes a supplying-end module 1 and a receiving-end module 2. The supplying-end module 1 includes a supplying-end coil 116 and a resonant capacitor 115. The supplying-end coil 116 is used for delivering electromagnetic energies to the receiving-end module 2 to supply power. The resonant capacitor 115, coupled to the supplying-end coil 116, is used for performing resonance together with the supplying-end coil 116. In addition, in the supplying-end module 1, a magnetic conductor 117 composed of magnetic materials may be selectively disposed, to enhance the electromagnetic induction capability of the supplying-end coil 116 and also prevent electromagnetic energies from affecting the objects located at the non-inducting side of the coil.

In order to control the operations of the supplying-end coil 116 and the resonant capacitor 115, the supplying-end module 1 further includes a processor 111, a clock generator 112, a delay generator 113, power driver units 114A and 114B, a voltage dividing circuit 130 and a peak detector 140. The power driver units 114A and 114B, coupled to the supplying-end coil 116 and the resonant capacitor 115, are used for sending driving signals D1 and D2 to the supplying-end coil 116. The power driver units 114A and 114B may be controlled by the processor 111 and the clock generator 112, for driving the supplying-end coil 116 to generate and send power. When the power driver units 114A and 114B are both active, full-bridge driving is performed. The clock generator 112, coupled to the power driver units 114A and 114B, is used for outputting control signals S1 and S2, respectively, to control the power driver units 114A and 114B to send the driving signals D1 and D2. The clock generator 112 may be a pulse width modulation (PWM) generator or other type of clock generator, for outputting a clock signal to the power driver units 114A and 114B. The delay generator 113, coupled between the clock generator 112 and the power driver unit 114B, is used for delaying the control signal S2 to generate a delay signal S2' and output the delay signal S2' to the power driver unit 114B. The delay generator 113 may selectively output the delay signal S2' delayed by different time lengths, and the delay time is controlled by the processor 111. In an embodiment, the delay generator 113 may include a delay chain composed of multiple inverters, but is not limited herein. The voltage dividing circuit 130, which includes voltage dividing resistors 133 and 134, may attenuate a coil signal C1 on the supplying-end coil 116 and then output the coil signal C1 to the processor 111 and the peak detector 140, wherein the coil signal C1 is a voltage signal between the supplying-end coil 116 and the resonant capacitor 115. In some embodiments, if the tolerance voltages of the circuits in the processor 111 and the peak detector 140 are high enough, the voltage dividing circuit 130 may not be included and the peak detector 140 may directly receive the coil signal C1 from the supplying-end coil 116. The peak detector 140, coupled to the supplying-end coil 116, is used for detecting the coil signal C1 of the supplying-end coil 116 to obtain a peak location of the coil signal C1. The processor 111, coupled to devices such as the power driver units 114A and 114B, the delay generator 113 and the peak detector 140, is used for controlling every operation of the supplying-end module 1 and adjusting the output power of the supplying-end module 1. Other possible components or modules such as a power supply unit and display unit may be included or not according to system requirements. These components are omitted herein without affecting the illustrations of the present embodiments.

Please keep referring to FIG. 4. The receiving-end module 2 includes a receiving-end coil 216, which is used for receiving power from the supplying-end coil 116. In the receiving-end module 2, a magnetic conductor 217 composed of magnetic materials may also be selectively disposed, to enhance the electromagnetic induction capability of the receiving-end coil 216 and also prevent electromagnetic energies from affecting the objects located at the non-inducting side of the coil. The receiving-end coil 216 may send the received power to a load unit 21 in the back end. Other possible components or modules in the receiving-end module 2 such as a regulator circuit, resonant capacitor, rectification circuit, signal feedback circuit and receiving-end processor may be included or not according to system requirements. These components are omitted herein without affecting the illustrations of the present embodiments.

In an embodiment, the peak detector 140 includes a comparator 141 and a digital to analog converter (DAC) 151, for detecting the peak location of the coil signal C1. The processor 111 may set a reference voltage Vref and output a digital value corresponding to the reference voltage Vref to the DAC 151. The DAC 151 then converts the digital value into the reference voltage Vref. Subsequently, the comparator 141 may compare the coil signal C1 with the reference voltage Vref to output a peak signal P1, and transmit the peak signal P1 to the processor 111. More specifically, the reference voltage Vref may be set to be slightly lower than the value of the peak magnitude of the coil signal C1; hence, a pulse signal may appear at the peak location of the coil signal C1 in the peak signal P1 outputted by the comparator 141. Subsequently, the processor 111 may determine the middle point of the pulse signal to be the peak location of the coil signal C1. The detailed operations of the processor 111 obtaining the peak location of the coil signal C1 according to the pulse signal are narrated in U.S. Publication No. 2015/0349546 A1. In short, the processor 111 may record the time points of the rising edge and falling edge of the pulse signal via a timer, and calculate the middle time point of the pulse signal, where the middle time point is considered as the peak location of the coil signal C1. The difference between U.S. Publication No. 2015/0349546 A1 and the present invention is that, U.S. Publication No. 2015/0349546 A1 applies a capacitor to provide a constant voltage as the reference voltage, while the reference voltage Vref of the present invention is set by the processor 111 and the DAC 151 outputs the analog voltage value of the reference voltage Vref. The reference voltage Vref set by the method of the present invention has a higher accuracy, and may be used to realize more accurate determination of the peak location.

Subsequently, the processor 111 may control the delay time of the delay signal S2' outputted by the delay generator 113 according to the peak location, to set a phase shift quantity between the driving signals D1 and D2 outputted by the power driver units 114A and 114B. Different from the conventional method where inverse driving signals are outputted via the control signals without any delay, the present invention applies the delay generator 113 to delay the control signal. Therefore, the driving signals D1 and D2 outputted by the power driver units 114A and 114B may not be exactly inverse signals, where there exists a specific phase shift between the signals. In general, when the driving signals D1 and D2 are exactly inverse rectangular wave signals, a maximum output power of the induction type power supply system may be achieved. Any phase shift may decrease the driving capability of the driving signals D1 and D2 for driving the supplying-end coil 116. This thereby reduces the output power. Through the delay time control of the delay generator 113, the present invention may vary the phase relations of the driving signals D1 and D2, in order to achieve effective output power adjustment. In this embodiment, the phase shift quantity means a magnitude of phase shift. In an embodiment, the phase shift quantity is defined to be zero when the driving signals D1 and D2 are exactly inverse rectangular wave signals. Under the same operating frequency, the output power of the supplying-end module 1 reaches a maximum level when the phase shift quantity equals zero. In addition, if the delay time of the delay signal S2' becomes larger, the driving signals D1 and D2 may deviate from inverse signals; hence, the phase shift quantity becomes larger, and thus the output power of the supplying-end module 1 becomes smaller. In an embodiment, an upper limit of the phase shift quantity may be set, in order to prevent that the phase shift quantity is too large such that the driving capability of the driving signals D1 and D2 becomes too low. If the phase shift quantity is too large, the system may also become unstable due to excessive deviation of the driving signals D1 and D2. For example, the upper limit of the phase shift quantity may be set to be equal to a quarter of period of the driving signals D1 and D2, i.e., the phase difference of the driving signals D1 and D2 is equal to 90 degrees. At this moment, the output power of the supplying-end module 1 may have a minimal value.

Furthermore, after the processor 111 obtains the peak signal P1 from the peak detector 140 and determines the peak location of the coil signal C1, the processor 111 may determine a peak deviation rate of the peak location according to a starting point of the period of the driving signal D2 and a zero load point. The starting point of the period of the driving signal D2 may be set to the location of the rising edge of the driving signal D2. According to the characteristics of the induction type power supply system, the peak location may be at a quarter of the period of the driving signal D2 after the starting point of the period of the driving signal D2 when the induction type power supply system has no load and the phase shift quantity of the driving signals D1 and D2 is zero (i.e., the driving signals D1 and D2 are exactly inverse rectangular wave signals). This location may be defined as the zero load point. When the load of the induction type power supply system gradually increases, the peak location may move toward the starting point of the period of the driving signal D2 from the zero load point. When the induction type power supply system has full load, the peak location may reach the starting point of the period of the driving signal D2. The present invention may determine the peak deviation rate according to the above characteristics of the induction type power supply system. That is, the peak deviation rate equals zero when the peak location is at the zero load point; and the peak deviation rate equals one hundred percent when the peak location is located at the starting point of the period of the driving signal D2. If the induction type power supply system is not overloaded, the peak location may move between the zero load point and the starting point of the period of the driving signal D2; hence, the peak deviation rate may move between zero and one hundred percent. More specifically, the peak deviation rate is equal to the distance between the peak location and the zero load point divided by the distance between the starting point of the period of the driving signal D2 and the zero load point.

Figure 5A:
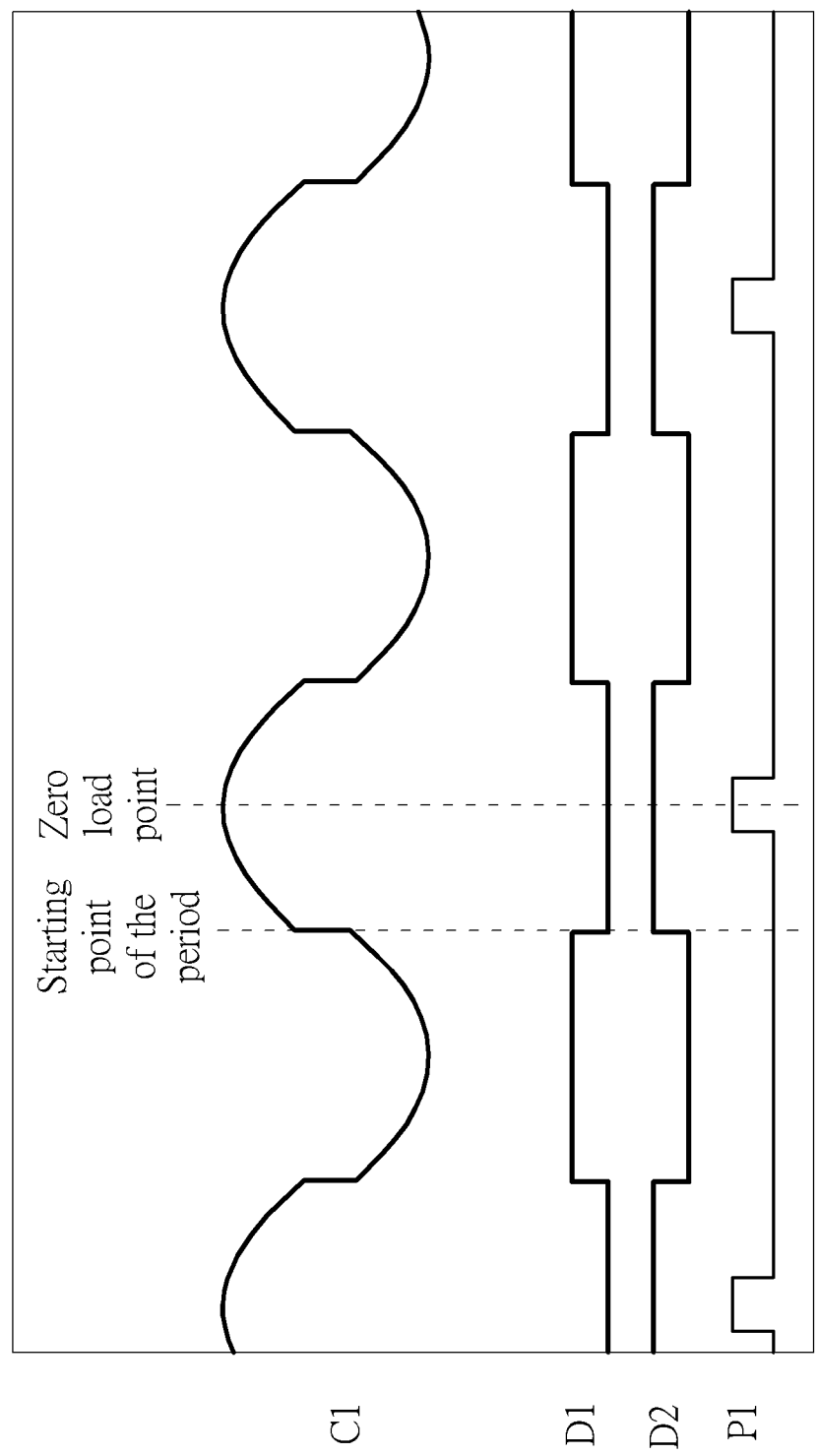
FIGS. 5A-5C are waveform diagrams illustrating the peak deviation rate corresponding to different loads when the phase shift quantity of the driving signals is zero according to embodiments of the present invention.
Figure 5B:
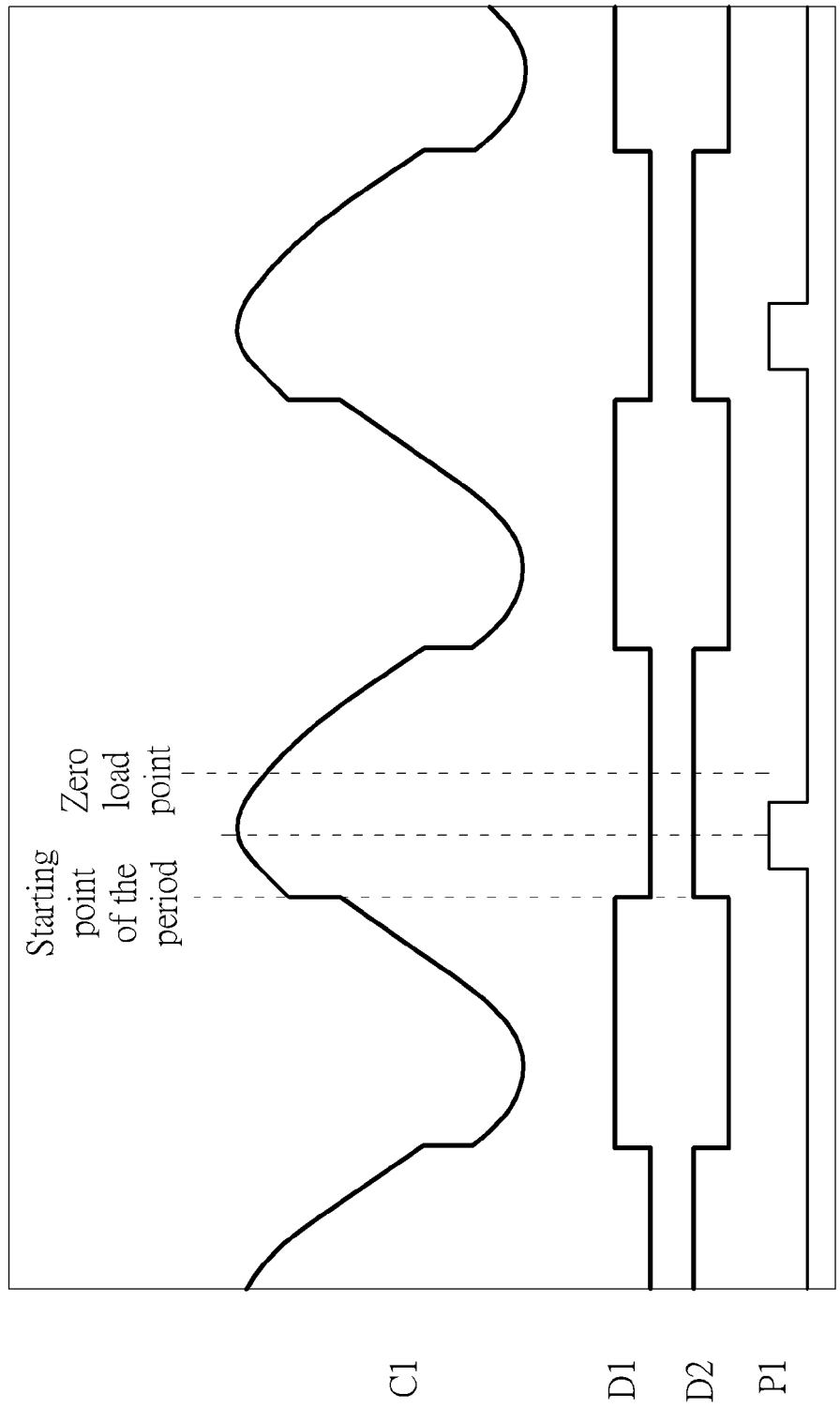
Figure 5C:
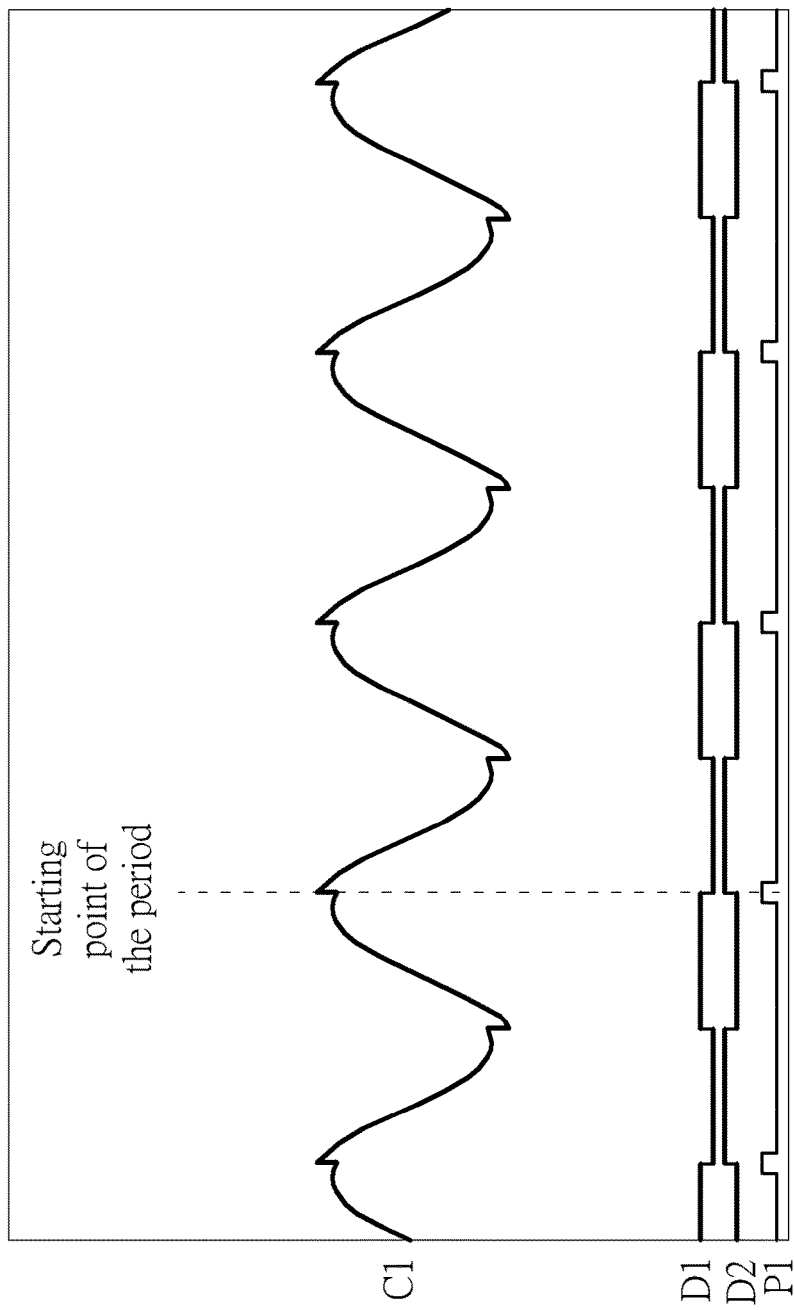

Please refer to FIGS. 5A-5C, which are waveform diagrams illustrating the peak deviation rate corresponding to different loads when the phase shift quantity of the driving signals D1 and D2 is zero according to embodiments of the present invention. FIGS. 5A-5C illustrates waveforms of the coil signal C1, the driving signals D1 and D2 and the peak signal P1, wherein FIG. 5A, FIG. 5B and FIG. 5C illustrate the conditions where the induction type power supply system has no load, partial load and full load, respectively. As shown in FIG. 5A, when the induction type power supply system has no load, the peak location is at a quarter of the period of the driving signal D2 after the starting point of the period (i.e., the zero load point mentioned above). At this moment, the peak deviation rate is equal to zero. The peak signal P1 is a pulse signal corresponding to the peak location, where the middle point of each pulse signal may be aligned to the corresponding peak location in the resonant period. As shown in FIG. 5B, when a load of the induction type power supply system appears, the peak location moves toward the starting point of the period of the driving signal D2. At this moment, the peak deviation rate is between zero and one hundred percent. As shown in FIG. 5C, when the induction type power supply system is full-loaded, the peak location is at the starting point of the period of the driving signal D2. At this moment, the peak deviation rate is equal to one hundred percent. Note that the induction type power supply system may operate at different operating frequencies under different loading magnitudes. In such a situation, the period lengths of the driving signal D2 may be different, and the absolute position of the zero load point may also be different. Therefore, the peak deviation rate is calculated according to the relative positions of the peak location, the starting point of the period of the driving signal D2, and the zero load point, rather than the absolute positions. Thus, the calculation may not be affected when the operating frequency changes.

As mentioned above, the present invention may adjust the output power by varying the phase relations of the driving signals D1 and D2, and the peak deviation rate is used for determining the load magnitudes. Therefore, the processor 111 may adjust the phase shift quantity of the driving signals D1 and D2 according to the calculated peak deviation rate, i.e., the processor 111 may adjust the delay time on the driving signal D2 generated by the delay generator 113. As a result, the processor 111 may adjust the output power to adapt to the load variations.

Figure 6:
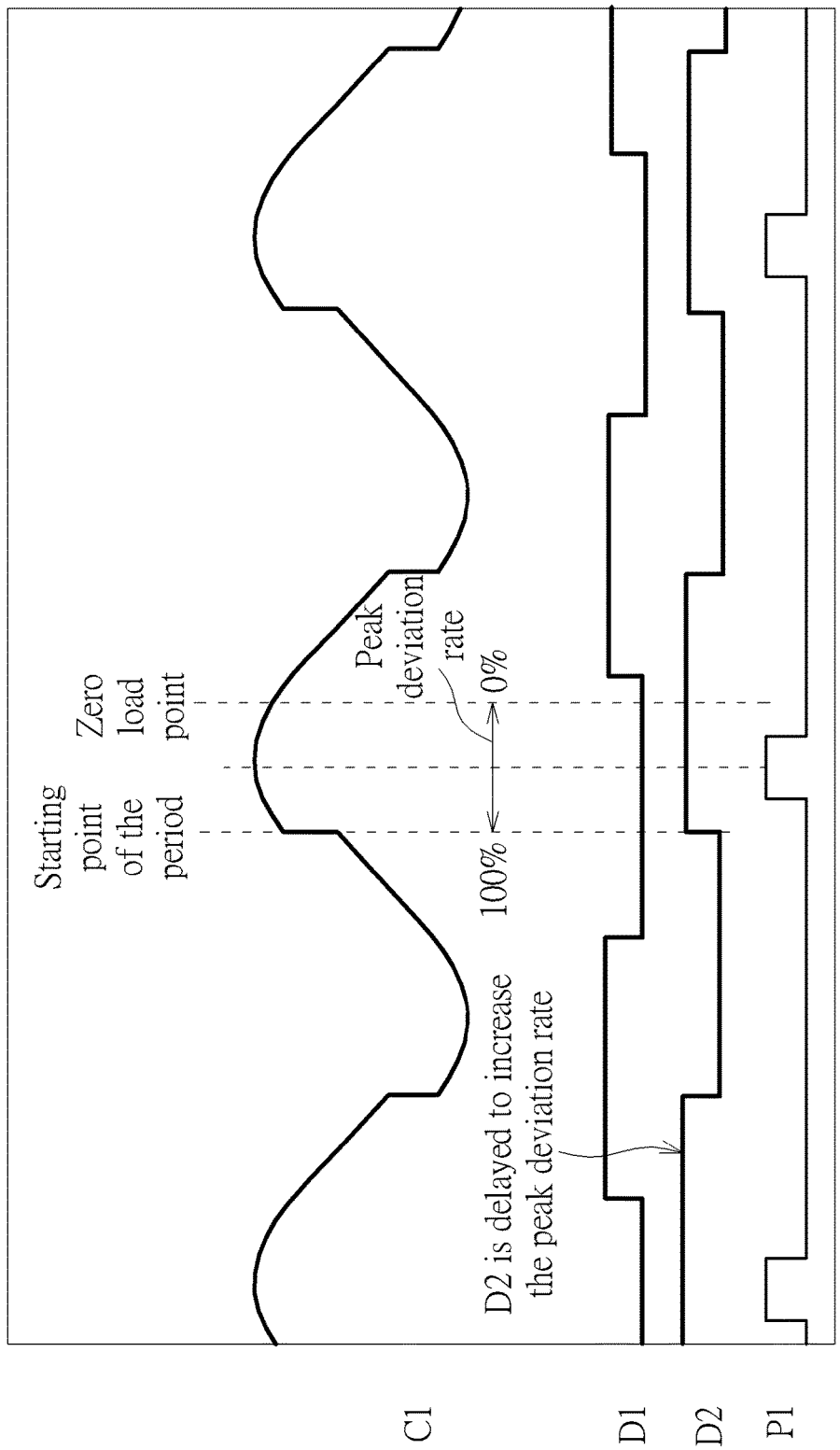
FIG. 6 is a waveform diagram illustrating the output power of the induction type power supply system adjusted via phase movement of the driving signals according to an embodiment of the present invention.

Please refer to FIG. 6, which is a waveform diagram illustrating the output power of the induction type power supply system adjusted via phase movement of the driving signals D1 and D2 according to an embodiment of the present invention. FIG. 6 illustrates a no-load condition. When the phase of the driving signals D1 and D2 moves, the driving signal D2 should undergo a delay time, so that the starting point of the period of the driving signal D2 and the corresponding zero load point (i.e., the location of a quarter of period after the starting point) are delayed as well. Therefore, the peak location may move toward the starting point, and the peak deviation rate increases accordingly, as shown in FIG. 6. In such a condition, even if the induction type power supply system has no load, the peak deviation rate may become larger when the delay time of the driving signal D2 becomes longer.

Please note that there is not any load driving requirements when the induction type power supply system 400 has no load; hence, the processor 111 may increase the phase shift quantity of the driving signals D1 and D2 to reduce the output power. In comparison with the prior art where the exactly inverse driving signals are always applied, the present invention reduces the output power via phase movement and thereby reduces waste power. In addition, when there is a phase movement between the driving signals D1 and D2, the entire power output capability may fall; hence, in order to drive similar load magnitudes, the operating frequency of the coil may also fall. The falling operating frequency of the coil reduces the switching frequency of the elements in the induction type power supply system 400. This reduces the wear and tear of elements and thereby increases the life of elements.

Since the peak deviation rate is affected by both the load magnitude and the delay time, the peak deviation rate becomes larger when the load is larger, and the peak deviation rate becomes larger also when the delay time is longer, where the longer delay time corresponds to a larger phase shift quantity and weaker output power. In such a condition, the processor 111 may set a predefined peak deviation rate or a predefined peak deviation range, and adjust the phase shift quantity of the driving signals D1 and D2 via control of the delay time, in order to adjust the peak deviation rate to be equal to the predefined peak deviation rate or to be within the predefined peak deviation range. For example, when the induction type power supply system boots up and does not receive any load yet, the processor 111 may adjust the phase shift quantity of the driving signals D1 and D2, allowing the peak deviation rate to be located within the predefined peak deviation range. When the load is introduced to make the peak location move toward the starting point of the period of the driving signal D2 and thus the peak deviation rate rises above the predefined peak deviation range, the processor 111 may decrease the delay time of the delay generator 113 to reduce the phase shift quantity of the driving signals D1 and D2, in order to make the peak deviation rate fall and return to the predefined peak deviation range. At this moment, the induction type power supply system may increase its output power to adapt itself to the increasing load. When the load decreases to make the peak location move toward the zero load point and thus the peak deviation rate falls below the predefined peak deviation range, the processor 111 may increase the delay time of the delay generator 113 to enhance the phase shift quantity of the driving signals D1 and D2, in order to make the peak deviation rate rise and return to the predefined peak deviation range. At this moment, the induction type power supply system may decrease its output power to adapt itself to the decreasing load. On the other hand, when the peak deviation rate is within the predefined peak deviation range, the processor 111 may stop adjusting the phase shift quantity of the driving signals D1 and D2; that is, the present phase shift quantity and delay time is applied to drive the load.

Figure 7:
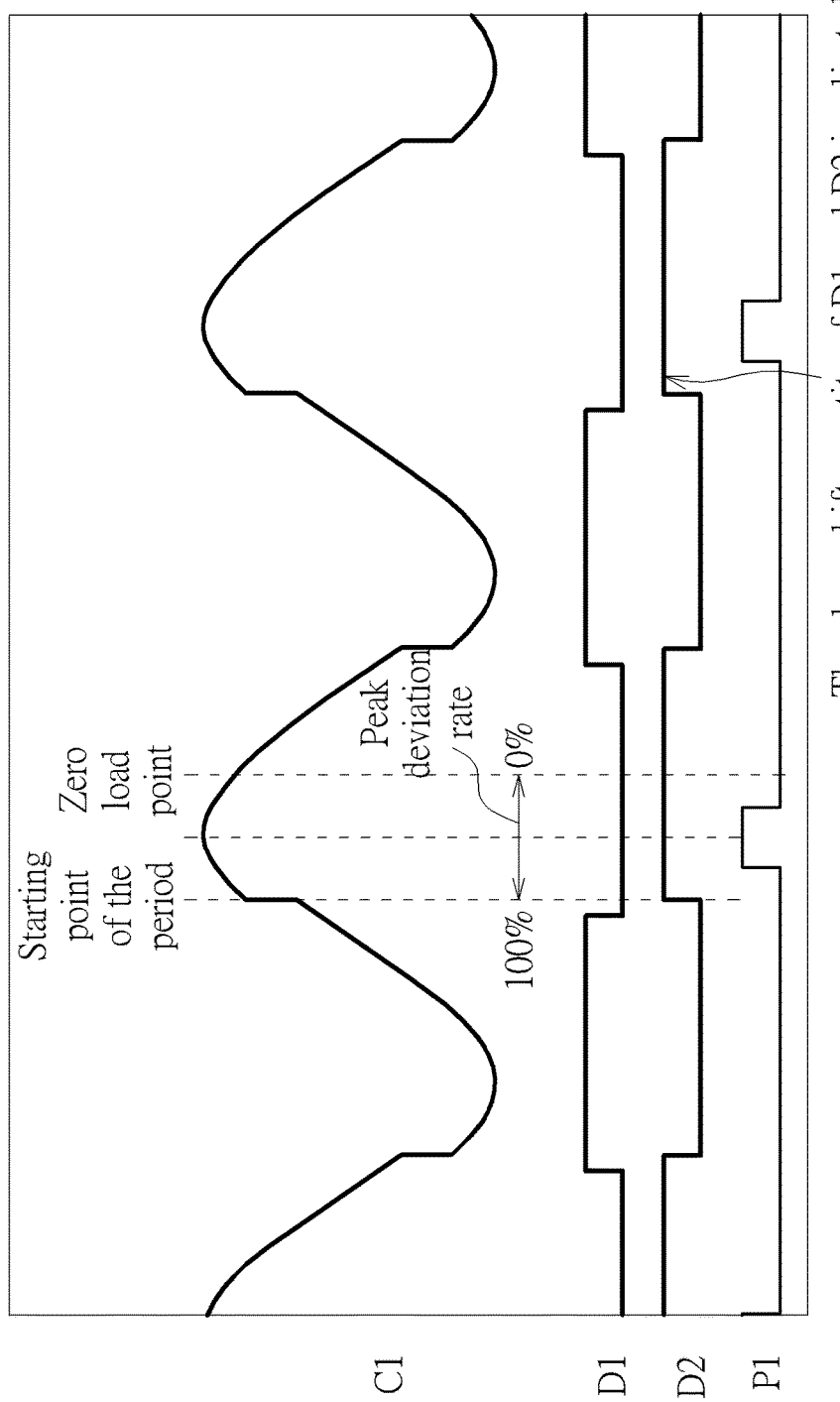
FIG. 7 is a waveform diagram illustrating the output power of the induction type power supply system adjusted via phase movement of the driving signals when the load increases.

Taking FIG. 6 as an example, the processor 111 may set the predefined peak deviation range to be within a specific range near fifty percent (e.g., 48%-52%), and change the peak deviation rate by adjusting the phase shift quantity of the driving signals D1 and D2, allowing the phase shift quantity to be within the predefined peak deviation range. Please refer to FIG. 7 together with FIG. 6, where FIG. 7 illustrates a waveform diagram illustrating the output power of the induction type power supply system adjusted via phase movement of the driving signals D1 and D2 when the load increases. As shown in FIG. 7, when the load increases, the processor 111 may adjust the phase shift quantity of the driving signals D1 and D2, allowing the driving signals D1 and D2 to be closer to inverse rectangular wave signals, in order to control the peak deviation rate to remain within the predefined peak deviation range. In such a condition, since the driving signals D1 and D2 are closer to inverse rectangular wave signals, the induction type power supply system may output higher power to adapt itself to the increasing load.

Please note that the present invention provides a method of adjusting output power via phase adjustment of the driving signals in the induction type power supply system. Those skilled in the art may make modifications and alternations accordingly. For example, in the above embodiments, the processor 111 may detect the peak location anytime, and adjust the phase shift quantity of the driving signals D1 and D2 to adapt to load variations when detecting that the peak deviation rate exceeds the predefined peak deviation range. In some embodiments, the processor 111 may stop adjusting the phase shift quantity when determining that the supplying-end module receives a noise, or when determining that the supplying-end module receives modulation data from the receiving-end module of the induction type power supply system. Since the noise and modulation data may change the peak values and thereby affect the determination of peak locations, the processor 111 should stop adjusting the phase shift quantity to prevent wrong adjustment from resulting in instability of the system when the noise or modulation data arrives. In detail, the modulation signal may generate up and down vibrations on the peak values of the coil signal C1 during a period of time, such that the processor 111 may not obtain the peak location during several coil driving periods, especially when the peak values move downward and become lower than the reference voltage Vref. Also, the noise may cause that the peak value of the coil signal C1 falls below the reference voltage Vref. In such a condition, the processor 111 may stop adjusting the phase shift quantity of the driving signals D1 and D2 when the peak location is not obtained in at least one coil driving period during a specific period of time, in order to prevent the noise or modulation data from affecting the determination of peak locations.

Figure 1:
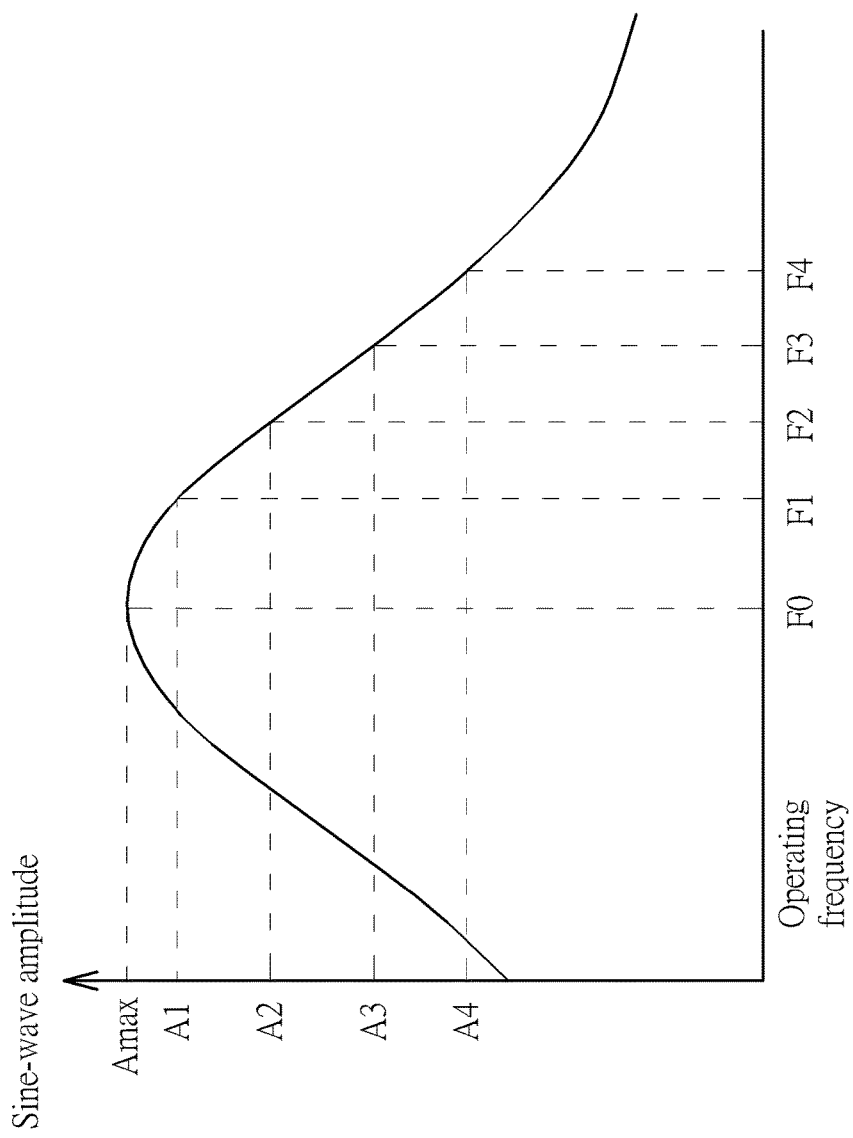
FIG. 1 is a schematic diagram of the resonant curve of the coil of the induction type power supply system.
Figure 2:
FIG. 2 is a waveform diagram of signals when the load of the power receiving terminal increases.
Figure 3:
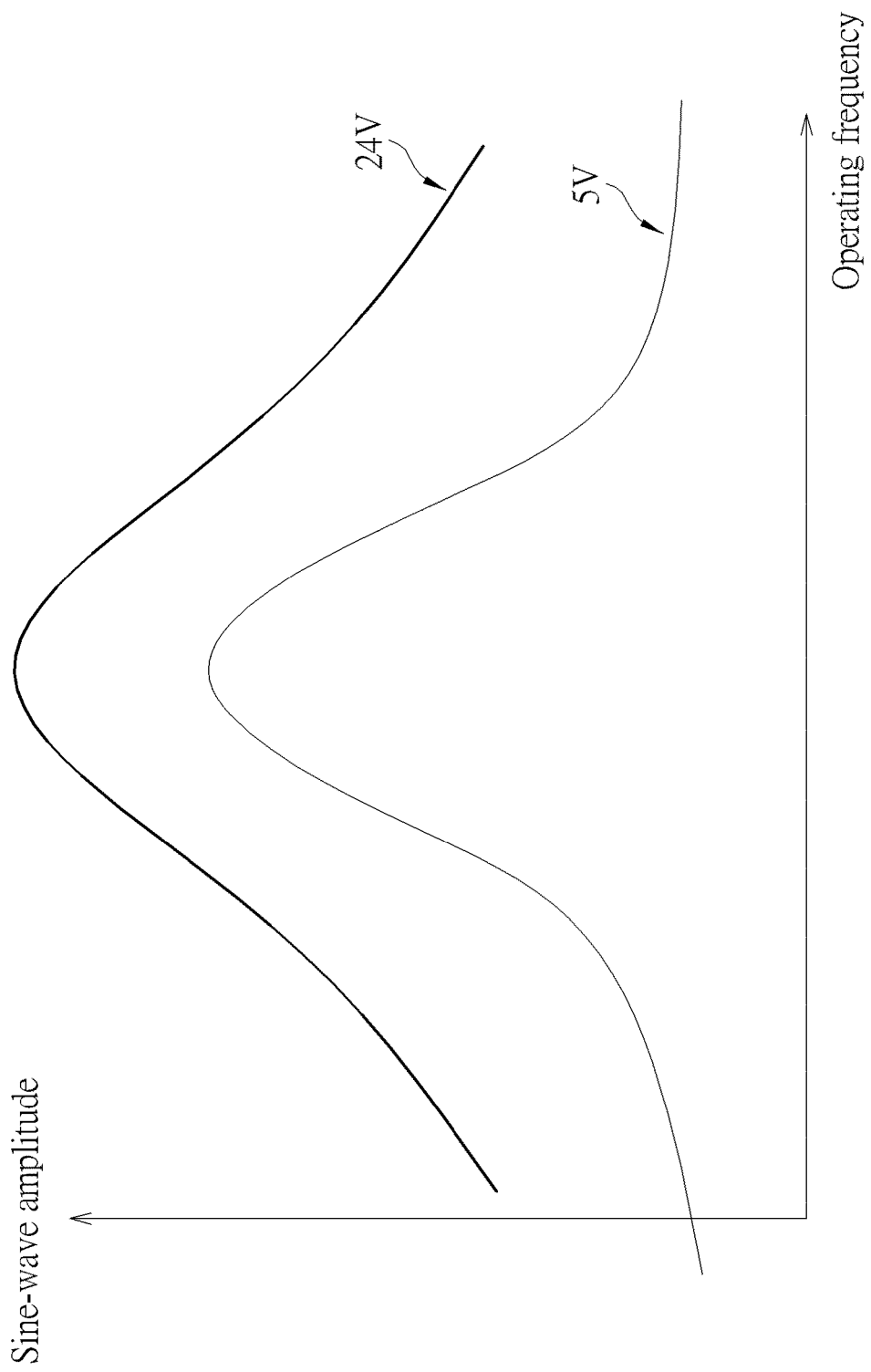
FIG. 3 is a schematic diagram of resonant curves of the coil under driving signals having different voltage amplitudes in an induction type power supply system.
Figure 8:
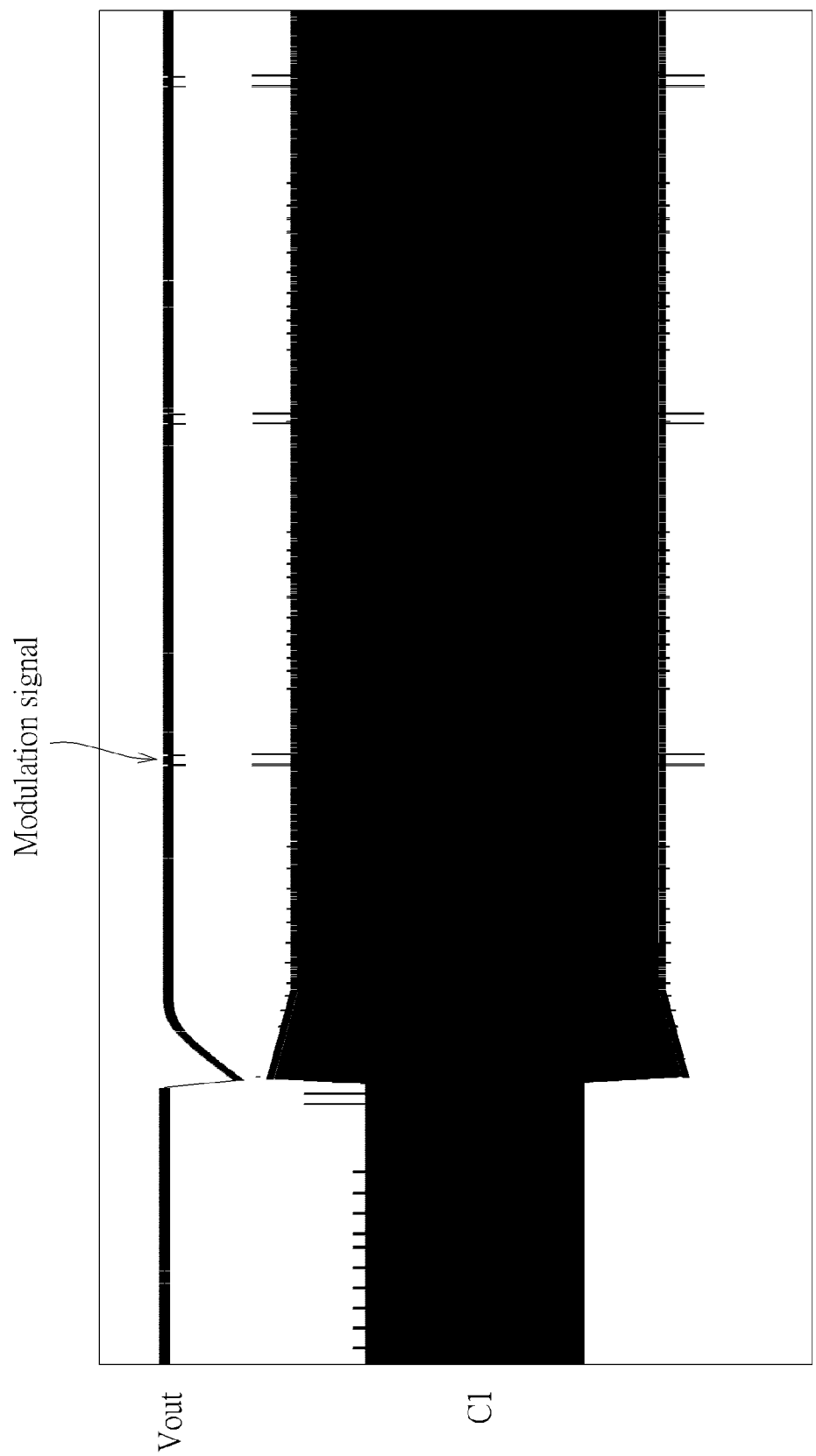
FIG. 8 is a waveform diagram of signals where the output power increases when the load of the power receiving terminal increases according to an embodiment of the present invention.

In the conventional art, when load variation occurs in the induction type power supply system, it should be detected by the power receiving terminal and then the power receiving terminal transmits related information to the power supplying terminal via the modulation signal. The power supplying terminal may adjust the output power accordingly. Therefore, several transmissions of the modulation signals may be necessary for the power supplying terminal to revert the output voltage back to the predetermined voltage via adjustment of the output power, as shown in FIG. 2. In contrast with this, the output power adjustment method of the present invention may perform detection on the peak location of the coil signal and the peak deviation rate only via the power supplying terminal; hence, the detection result may be obtained by the power supplying terminal rapidly, in order to adjust the phase shift quantity of the driving signals and thereby adjust the output power. Therefore, the output power adjustment method of the present invention may rapidly perform output power adjustment based on the load variations. Please refer to FIG. 8, which is a waveform diagram of signals where the output power increases when the load of the power receiving terminal increases according to an embodiment of the present invention. FIG. 8 illustrates waveforms of the output voltage Vout of the receiving-end module and the coil signal C1 of the supplying-end coil. As shown in FIG. 8, there are periodical vibrations on the output voltage Vout and the coil signal C1, and these vibrations are generated due to the modulation signal from the receiving-end module. In this embodiment, when a sudden load appears and forces the output voltage Vout to fall instantly, the power supplying terminal may detect the load variation immediately and increase the output power correspondingly, allowing the output voltage Vout to rise back rapidly. As can be seen in the waveforms shown in FIG. 8, the time required for the output voltage Vout to rise back to the predetermined voltage is far smaller than a transmission period of the modulation signal.

Figure 9:
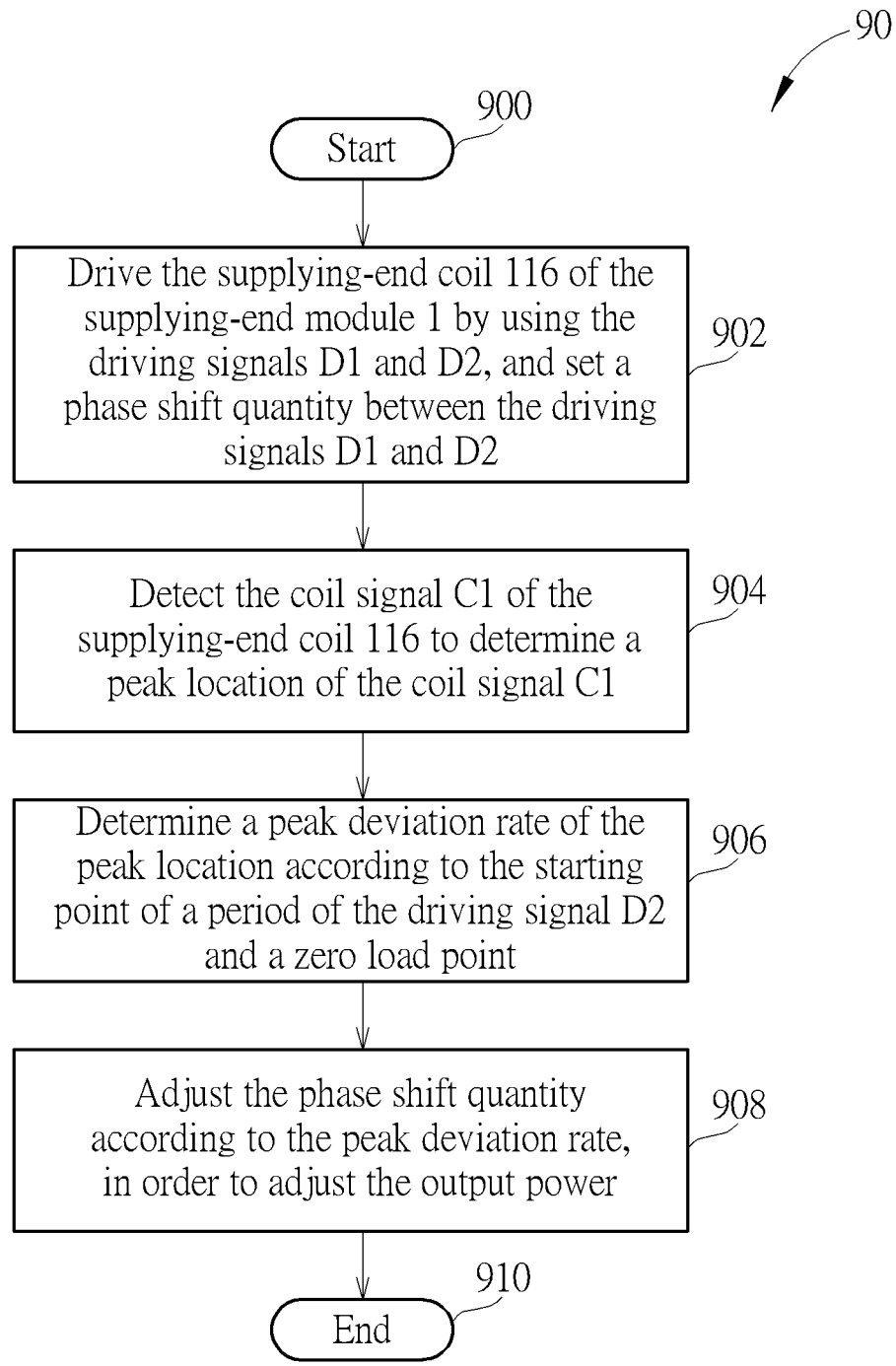
FIG. 9 is a schematic diagram of a power adjustment process according to an embodiment of the present invention.

The above operations related to output power adjustment of the induction type power supply system may be summarized into a power adjustment process 90, as shown in FIG. 9. The power adjustment process 90, which may be realized in the power supplying terminal of an induction type power supply system such as the supplying-end module 1 of the induction type power supply system 400 shown in FIG. 4, includes the following steps:

Step 900: Start.

Step 902: Drive the supplying-end coil 116 of the supplying-end module 1 by using the driving signals D1 and D2, and set a phase shift quantity between the driving signals D1 and D2.

Step 904: Detect the coil signal C1 of the supplying-end coil 116 to determine a peak location of the coil signal C1.

Step 906: Determine a peak deviation rate of the peak location according to the starting point of a period of the driving signal D2 and a zero load point.

Step 908: Adjust the phase shift quantity according to the peak deviation rate, in order to adjust the output power.

Step 910: End.

Figure 10:
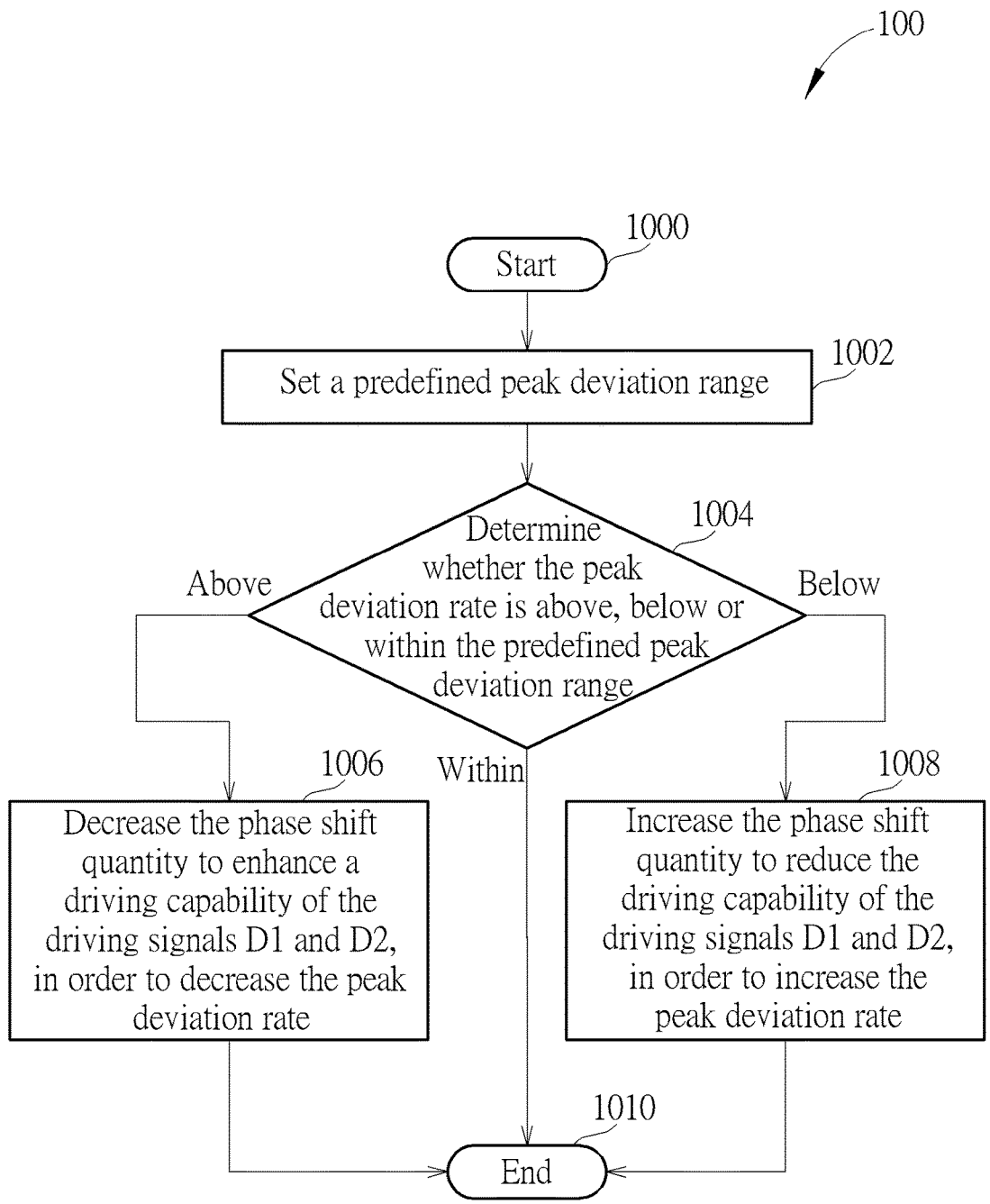
FIG. 10 is a schematic diagram of a detailed power adjustment process according to an embodiment of the present invention.

Further, the above step of adjusting the phase shift quantity according to the peak deviation rate may be summarized into a detailed power adjustment process 100, as shown in FIG. 10. The detailed power adjustment process 100 includes the following steps:

Step 1000: Start.

Step 1002: Set a predefined peak deviation range.

Step 1004: Determine whether the peak deviation rate is above, below or within the predefined peak deviation range. If the peak deviation rate is above the predefined peak deviation range, go to Step 1006; if the peak deviation rate is below the predefined peak deviation range, go to Step 1008; if the peak deviation rate is within the predefined peak deviation range, go to Step 1010.

Step 1006: Decrease the phase shift quantity to enhance a driving capability of the driving signals D1 and D2, in order to decrease the peak deviation rate.

Step 1008: Increase the phase shift quantity to reduce the driving capability of the driving signals D1 and D2, in order to increase the peak deviation rate.

Step 1010: End.

Please note that the above detailed power adjustment process 100 may be performed when the noise or modulation data is not received. The detailed operations and other alternations of the power adjustment process 90 and the detailed power adjustment process 100 are illustrated in the above descriptions, and will not be narrated herein.

To sum up, the present invention provides a method of adjusting output power of an induction type power supply system, in order to realize fast power adjustment and also reduce power loss of the induction type power supply system on standby. The supplying-end module may include a delay generator, for generating delay signals for any one of the power driver units, to change the phase difference of two driving signals outputted by the power driver units. When the two driving signals are rectangular waves inverse to each other, maximum output power may be achieved. If one of the driving signals is delayed so that the two driving signals deviate from the inverse rectangular waves, the output power may fall. By adjusting the delay time, the present invention may adjust the output power. In addition, the present invention may detect the relations of the peak location relative to the starting point of the period of the driving signal and the zero load point to detect load variations. When an evident variation of the load occurs, the peak deviation rate may depart from the predefined peak deviation range. In such a condition, the delay time of the delay signal may be varied to control the peak deviation rate to revert back to the predefined peak deviation range, where the output power is adjusted to adapt to the load variations. As a result, the present invention may adjust the output power via determination of the peak location, which significantly increases the speed of power adjustment. Also, the method of changing the output power via phase adjustment may reduce the output power of the induction type power supply system, in order to reduce the power loss of the induction type power supply system on standby or with no load.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for a supplying-end module of an induction type power supply system, for adjusting output power of the induction type power supply system, the method comprising:
    driving a supplying-end coil of the supplying-end module by using a first driving signal and a second driving signal, and setting a phase shift quantity between the first driving signal and the second driving signal;
    detecting a coil signal of the supplying-end coil to determine a peak location of the coil signal;
    determining a peak deviation rate of the peak location according to a starting point of a period of the second driving signal and a zero load point; and
    adjusting the phase shift quantity according to the peak deviation rate, in order to adjust the output power.

2. The method of claim 1, wherein the zero load point is a location at a quarter of the period of the second driving signal after the starting point of the period of the second driving signal.

3. The method of claim 1, wherein the peak location is at the zero load point and the peak deviation rate is zero when the first driving signal and the second driving signal are inverse to each other and the induction type power supply system has no load.

4. The method of claim 1, wherein the peak location is at the starting point of the period of the second driving signal and the peak deviation rate is one hundred percent when the first driving signal and the second driving signal are inverse to each other and the induction type power supply system has full load.

5. The method of claim 1, wherein the peak deviation rate is equal to a distance between the peak location and the zero load point divided by a distance between the starting point of the period of the second driving signal and the zero load point.

6. The method of claim 1, wherein the step of adjusting the phase shift quantity according to the peak deviation rate in order to adjust the output power comprises:
    setting a predefined peak deviation range;
    decreasing the phase shift quantity to enhance a driving capability of the first driving signal and the second driving signal when the peak deviation rate is above the predefined peak deviation range, in order to decrease the peak deviation rate;
    increasing the phase shift quantity to reduce the driving capability of the first driving signal and the second driving signal when the peak deviation rate is below the predefined peak deviation range, in order to increase the peak deviation rate; and
    stopping adjusting the phase shift quantity when the peak deviation rate is within the predefined peak deviation range.

7. The method of claim 1, further comprising:
    stopping adjusting the phase shift quantity when the supplying-end module determines that a noise is received or that a data from a receiving-end module of the induction type power supply system is received.

8. A supplying-end module for an induction type power supply system, for adjusting output power of the induction type power supply system, the supplying-end module comprising:
    a supplying-end coil;
    at least one power driver unit, coupled to the supplying-end coil, for sending a first driving signal and a second driving signal to drive the supplying-end coil;

a delay generator, coupled to a power driver unit among the at least one power driver unit, for generating a delay signal and outputting the delay signal to the power driver unit;

a peak detector, coupled to the supplying-end coil, for detecting a coil signal of the supplying-end coil to obtain a peak signal in the coil signal; and a processor, coupled to the at least one power driver unit, the delay generator and the peak detector, for performing the following steps:

controlling the delay generator to output the delay signal to set a phase shift quantity between the first driving signal and the second driving signal;

obtaining the peak signal from the peak detector and determining a peak location of the coil signal accordingly;

determining a peak deviation rate of the peak location according to a starting point of a period of the second driving signal and a zero load point; and adjusting the phase shift quantity according to the peak deviation rate, in order to adjust the output power.

9. The supplying-end module of claim 8, wherein the zero load point is a location at a quarter of the period of the second driving signal after the starting point of the period of the second driving signal.

10. The supplying-end module of claim 8, wherein the peak location is at the zero load point and the peak deviation rate is zero when the first driving signal and the second driving signal are inverse to each other and the induction type power supply system has no load.

11. The supplying-end module of claim 8, wherein the peak location is at the starting point of the period of the second driving signal and the peak deviation rate is one hundred percent when the first driving signal and the second driving signal are inverse to each other and the induction type power supply system has full load.

12. The supplying-end module of claim 8, wherein the peak deviation rate is equal to a distance between the peak location and the zero load point divided by a distance between the starting point of the period of the second driving signal and the zero load point.

13. The supplying-end module of claim 8, wherein the processor further performs the following steps to adjust the phase shift quantity according to the peak deviation rate in order to adjust the output power:

setting a predefined peak deviation range;

decreasing the phase shift quantity to enhance a driving capability of the first driving signal and the second driving signal when the peak deviation rate is above the predefined peak deviation range, in order to decrease the peak deviation rate;

increasing the phase shift quantity to reduce the driving capability of the first driving signal and the second driving signal when the peak deviation rate is below the predefined peak deviation range, in order to increase the peak deviation rate; and stopping adjusting the phase shift quantity when the peak deviation rate is within the predefined peak deviation range.

14. The supplying-end module of claim 8, wherein the processor further performs the following step:

stopping adjusting the phase shift quantity when the processor determines that a noise is received by the supplying-end module or that a data from a receiving-end module of the induction type power supply system is received by the supplying-end module.

15. The supplying-end module of claim 8, wherein the delay signal generated by the delay generator is utilized for controlling the power driver unit coupled to the delay generator to output the second driving signal.

* * * * *